US011925070B2

(12) United States Patent
Tang et al.

(10) Patent No.: US 11,925,070 B2
(45) Date of Patent: Mar. 5, 2024

(54) DISPLAY PANEL

(71) Applicant: Kunshan Go-Visionox Opto-Electronics Co., Ltd., Jiangsu (CN)

(72) Inventors: Jing Tang, Jiangsu (CN); Junhui Lou, Jiangsu (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 413 days.

(21) Appl. No.: 17/345,803

(22) Filed: Jun. 11, 2021

(65) Prior Publication Data

US 2021/0305336 A1    Sep. 30, 2021

Related U.S. Application Data

(63) Continuation of application No. PCT/CN2019/112618, filed on Oct. 22, 2019.

(30) Foreign Application Priority Data

Apr. 12, 2019    (CN) .......................... 201910296126.0

(51) Int. Cl.
*H10K 59/122*    (2023.01)
*H10K 59/121*    (2023.01)
*H10K 59/131*    (2023.01)

(52) U.S. Cl.
CPC ....... *H10K 59/122* (2023.02); *H10K 59/1213* (2023.02); *H10K 59/1216* (2023.02); *H10K 59/131* (2023.02)

(58) Field of Classification Search
None
See application file for complete search history.

(56) References Cited

U.S. PATENT DOCUMENTS

| 8,692,454 B2 * | 4/2014 | Sakata | H10K 59/353 |
| | | | 428/917 |
| 2004/0113545 A1 * | 6/2004 | Pang | H10K 59/173 |
| | | | 313/504 |

(Continued)

FOREIGN PATENT DOCUMENTS

| CN | 105118929 A | 12/2015 |
| CN | 106024836 A | 10/2016 |

(Continued)

OTHER PUBLICATIONS

International Search Report and Written Opinion for International Application No. PCT/CN2019/112618 dated Jan. 31, 2020, 10 pages, with English Translation.

(Continued)

*Primary Examiner* — Evren Seven
(74) *Attorney, Agent, or Firm* — Quarles & Brady LLP

(57) ABSTRACT

Disclosed is a display panel. The display panel includes a semiconductor structure; the semiconductor structure includes a substrate and a partition structure, disposed on the substrate and arranged to partition a film layer disposed on the substrate; the partition structure includes at least a base film layer and a partition film layer that are stacked in sequence; the partition film layer covers the base film layer, and at least one side of the partition film layer extends beyond a corresponding side of the base film layer; and the partition film layer warpage has a warpage structure located at an end portion thereof.

14 Claims, 7 Drawing Sheets

(56) References Cited

U.S. PATENT DOCUMENTS

| | | | |
|---|---|---|---|
| 2004/0180457 A1* | 9/2004 | Birnstosk | H10K 59/35 |
| | | | 438/22 |
| 2005/0073243 A1* | 4/2005 | Yamazaki | H10K 71/135 |
| | | | 313/498 |
| 2016/0260936 A1 | 9/2016 | Okamoto et al. | |
| 2018/0034007 A1* | 2/2018 | He | H10K 50/822 |
| 2019/0165322 A1* | 5/2019 | Shinya | H10K 59/122 |

FOREIGN PATENT DOCUMENTS

| | | |
|---|---|---|
| CN | 106784352 A | 5/2017 |
| CN | 109004106 A | 12/2018 |
| CN | 208622778 U | 3/2019 |
| JP | H10106747 A | 4/1998 |

OTHER PUBLICATIONS

First Office Action of Priority Application CN 201910296126.0 dated May 15, 2020, 11 pages, with English Translation.

* cited by examiner

DISPLAY PANEL

CROSS-REFERENCE TO RELATED APPLICATIONS

This application is a bypass continuation application of International Application PCT/CN2019/112618, filed on Oct. 22, 2019, which claims priority to Chinese Patent Application No. 201910296126.0, filed on Apr. 12, 2019, and the disclosure of both applications are hereby incorporated by reference in their entireties.

TECHNICAL FIELD

The present disclosure relates to a field of display technology.

BACKGROUND

With the rapid development of electronic devices, user's requirements for the screen-to-body ratio become higher and higher, so that the full-screen-display technology of electronic devices attracts more and more attention from the industry.

SUMMARY

In view of the above, in order to address the above technical problem, it is necessary to provide a display panel, which increases the screen-body ratio in a true sense and achieves a true full-screen display.

In one aspect of the embodiments of the present disclosure, a display panel is provided and includes a semiconductor structure. The semiconductor structure includes:

a substrate; and a partition structure disposed on the substrate and arranged to partition a film layer disposed on the substrate;

the partition structure includes at least a base film layer and a partition film layer which are stacked in sequence, the partition film layer covers the base film layer, the partition film layer has at least one side extending beyond a corresponding side of the base film layer, and the partition film layer has a warpage structure located at an end portion thereof.

The partition film layer of the partition structure has the at least one side protruding beyond the side of the base film layer, and the end portion of the partition film layer is the warpage structure. In other words, the warpage structure is formed at the end portion of the partition film layer, so that the height of a gap between the lower surface of the end portion of the partition film layer and the substrate is greater than the thickness of the base film layer, which can effectively isolate the film layer arranged on the partition structure, thereby preventing adjacent structures in the same film layer, which need to be isolated from each other, from being coupled, and improving the working stability of the semiconductor structure.

According to the above-mentioned display panel, the partition structure provided in the semiconductor structure or in the display panel is a composited film layer structure, including the base film layer and the partition film layer that are stacked in sequence. Furthermore, a step can be formed between the base film layer and the partition film layer, and the end portion of the partition film layer is the warpage structure so that the height of the gap between the lower surface of the end portion of the partition film layer and the substrate is greater than the thickness of the base film layer.

In such a configuration, it ensures that the film layer needing to be isolated can be well isolated by the partition structure, thereby preventing adjacent structures in the same film layer, which need to be isolated from each other, from being coupled, and enabling the semiconductor structure or the display panel to work stably. Moreover, a process that is capable of achieving the patterning of the film layer is provided. The patterning or partition of the film layer can be achieved only by means of the processes of forming a film, photolithography patterning, etching, and curing, rather than, by repeatedly and circularly performing a series of complex multiple processes of forming a film, photolithography patterning, etching, removing and stripping the photoresist, and the like. Some specific processes or patterning can be achieved efficiently.

DETAILED DESCRIPTION OF THE EMBODIMENTS

Figure 1:
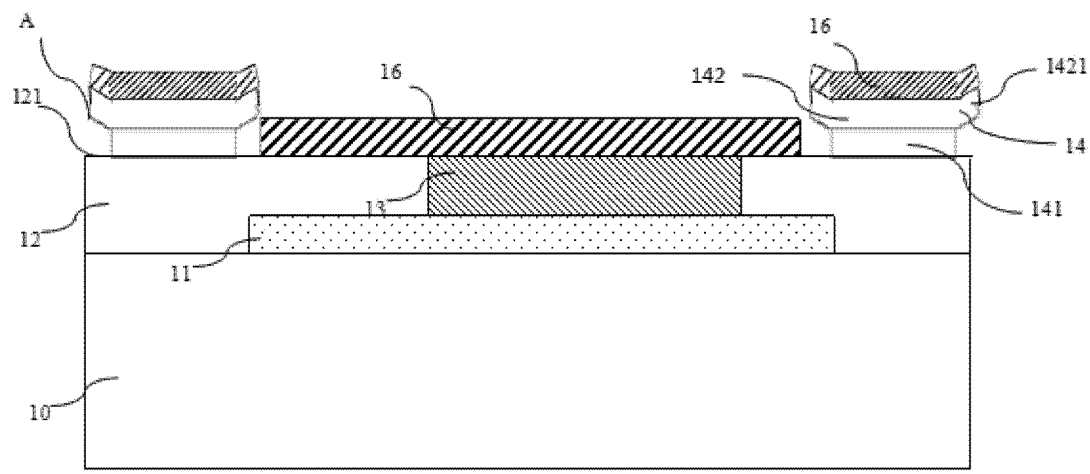
FIG. 1 is a schematic structural diagram illustrating a display panel according to an embodiment.

As for a conventional electronic device, such as a mobile phone, a Tablet PC, or the like, since it is required to integrate a front camera, an earphone, an infrared sensor, and the like, a notch is provided on the display. Since the camera, the earphone, the infrared sensor are disposed in the notched area, the notched area is not used to display images, for example, in the bang screen in the related technology. Or for electronic devices having a camera function, by means of notching the display, ambient light can enter photosensitive elements under the display through the notch of the display. However, these electronic devices are not in a full-screen display mode in a true sense, and not all regions of the whole display can display images, for example, images cannot be displayed in a camera region.

To make the present disclosure better understood, the present disclosure will be described more comprehensively in reference to the related accompanying drawings. The preferred embodiments of the present disclosure are provided in the accompanying drawings. However, the present disclosure can be implemented in various forms and is not limited to the embodiments described herein. On the contrary, the objective of providing these embodiments is to make the description of the present disclosure understood better and more thoroughly.

In addition, in the specification, the phrase "schematic plan view" refers to an accompanying drawing drawn by viewing an object from a top, and the phrase "cross-sectional view" refers to an accompanying drawing drawn by viewing a section obtained by vertically cutting the object from a side.

To address the problem that the images cannot be displayed in the camera region, the inventors have developed a display panel, which achieves a full-screen display of an electronic device by providing a transparent display panel in a notched area. According to different driving modes, OLED display panels can be classified into passive matrix OLED (PMOLED) display panels and active matrix OLED (AMOLED) display panels. Taking a PMOLED display panel as an example, display units in the same row of the PMOLED display array share electrodes having the same property, and the display units in the same column also share electrodes having the same property. Specifically, for an PMOLED display panel, the matrix is formed by a cathode and an anode. The pixels in the array are lit by scanning. Each pixel is operated under a short pulse mode to instantly emit light in high brightness. Researches show that the PMOLED display panel is not provided with a thin-film transistor (TFT) backplane and metal wirings, therefore the light transmittance of the PMOLED display panel is high, and the PMOLED display panel can be applied to the above-mentioned transparent display panel.

In general, in the PMOLED display panel, a partition barrier is formed between two adjacent rows or two adjacent columns by means of a photolithography process, so as to avoid coupling of the cathodes of the two adjacent rows or two adjacent columns, which will result in a short circuit. Through researches, the inventors found that in the process of forming the cathode layer by sputtering, the cathode layer will also be formed on the sidewalls of the partition barrier due to uncertain movement directions of metal atoms. Moreover, the formed cathode layer is well adhered to the sidewalls of the partition barrier, and is not easy to fall off, so that the cathode layer on the partition barrier and the cathode layer on the light-emitting layer are integrally connected, thus resulting in short circuits between the cathodes of two adjacent rows or two adjacent columns. Moreover, during evaporation to form a film layer having another structure, considering the shadow effects of the evaporation, the height of the partition barrier is required to be the same (usually about 2.5 μm) as the support layer for supporting the mask. In related configurations, the partition barriers are generally formed by means of lithography technology. The difficulty to isolate the cathodes is further increased due to the limitation of the height and materials of the partition barriers, and equipment, for example, the inclination angle of a sidewall of an inverted-trapezoid-shaped isolating barrier in the related configurations cannot be made small enough, which is not beneficial to a normal full-screen display.

For the PMOLED display panel, the cathode partition structure is a cathode isolating column. The fact that the display device becomes thinner and thinner limits the height of the cathode isolating column, thus disabling the cathode isolating column to isolate the cathode, and resulting in a short circuit between adjacent cathodes. When a combined display, for example, the combined display configured by integrating an AMOLED display panel and a PMOLED display panel, is used, the height of the cathode isolating columns in the PMOLED display panel will be further limited, so as to facilitate performing the subsequent processes of the AMOLED display panel.

Furthermore, as for the integrated combined display, indium tin oxide (hereinafter referred to as ITO), instead of Mg or Ag, can be used as the cathode of the PMOLED display panel, and the material of the cathode isolating columns can be organic adhesive. When the ITO thin-film is manufactured by means of the physical vapor deposition (hereinafter referred to as PVD), since the ITO thin-film has better step coverage on the organic adhesive, ITO thin-film will also adhere to the sidewalls of the cathode isolating columns. However, the ITO thin-film adhered to the side walls is adjacent to the adjacent cathodes, so that a continuous metal film layer is formed between the adjacent cathodes by means of the ITO thin-film adhered to the sidewalls of the cathode isolating columns and the ITO thin-film covering the upper surfaces of the cathode isolating columns, thus causing short circuits, degrading the effect of the cathode isolating columns on isolating the cathodes in the related arts, and increasing the risk of a connection between adjacent cathodes in the PMOLED display panel.

In addition, as for the AMOLED display panel, a large number of wiring layers, such as scanning lines, data lines, and the like, are provided in the display panel. In a process of forming the above-mentioned wirings, in general, a series of complex processes, such as forming a film, photolithography patterning, etching, removing and stripping photoresist, and the like, and the patterning of each layer is performed to adopt these complex processes repeatedly and circularly. Therefore, it is very difficult to satisfy the requirements of some specific processes or patterning.

In order to solve the above-mentioned problem, the embodiments of the present disclosure inventively provide a process capable of realizing the patterning or isolating of the film layer only by means of the processes of forming a film, photolithography patterning, etching, and curing, rather than by repeatedly and circularly performing a series of complex processes of forming a film, photolithography patterning, etching, removing and stripping the photoresist, and the like. Moreover, the embodiments of the present disclosure inventively provide the structure to implement isolating or patterning of the film layer, and the structure can realize the partition or patterning of the film layer required to be isolated or patterned in a semiconductor structure or a display panel. For example, in the display panel, a partition structure for cathodes, which is provided with a warpage structure at an end portion thereof, is formed on a pixel-defining layer, so as to further improve the effects of partition the cathodes. Moreover, it is possible to reduce or maintain the height of the partition column for the cathodes, so that the manufactured display panel has a better display performance and a smaller thickness. Alternatively, the patterning or isolating of other film layers, such as the metal wiring layer, can be realized by the patterning process.

Figure 2:
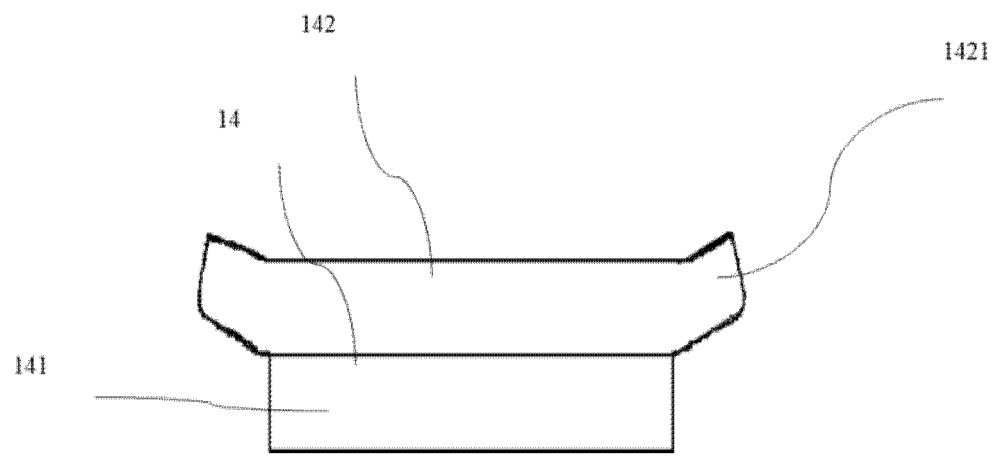
FIG. 2 is a schematic structural diagram illustrating a partition structure provided with a warpage structure according to an embodiment.

In an embodiment, a semiconductor structure is provided. The semiconductor structure includes a substrate and a partition structure disposed on the substrate. As shown in FIG. 2, the partition structure 14 is arranged to isolate the film layer thereon. The partition structure 14 includes at least a base film layer 141 and a partition film layer 142 which are stacked in sequence. The partition film layer 142 covers the base film layer 141, and the partition film layer 142 has at least one side protruding beyond the side of the base film layer 141, and an end portion of the partition film layer 42 is a warpage structure 1421. In other words, the height of a gap between a lower surface of the end portion of the partition film layer 142 and the substrate is greater than a thickness of the base film layer 141.

A person skilled in the art can understand that the configuration of the warpage structure at the end portion in the semiconductor structure can be applied to a thin-film transistor, a chip, or any other structure required to isolate the film layer. The application scenes thereof are not limited to this embodiment. In the following embodiments, only the application of the semiconductor structure in the manufacturing process of the display panel is described as an example.

In an embodiment, a display panel is further provided. The display panel includes a substrate and a partition structure 14 disposed on the substrate, so as to partition or pattern a film layer disposed on the substrate. Specifically, as shown in FIG. 1, the display panel can include the substrate 10, a first electrode (i.e. an anode 11), a pixel defining layer 12, a light-emitting layer 13, the partition structure 14, a second electrode (i.e. a cathode 16), and the like.

In an embodiment, substrate 10 can be a single-layer rigid substrate, such as a glass substrate, a quartz substrate, a plastic substrate, or the like. The substrate 10 can also be a single-layer flexible substrate, such as a polyimide (PI) film or the like. A corresponding functional layer, such as a buffer layer (BL) or the like, is formed on the substrate 10. Alternatively, substrate 10 can be a composited film-layer structure. For example, substrate 10 can include a glass substrate, a PI layer, a buffer layer (BL), and the like, which are stacked in sequence. The above-mentioned first electrode, i.e. the anode 11, is disposed on substrate 10. The pixel defining layer 12 covers an exposed surface of substrate 10 and part of an upper surface of the anode 11. The light-emitting layer 13 can pass through the pixel defining layer 12 and cover an exposed surface of the anode 11. The partition structure 14 can be disposed on an upper surface of the pixel defining layer 12, which is adjacent to the light-emitting layer 13. The cathode 16 can be formed on the light-emitting layer 13.

It should be understood that, in the process of forming the cathode 16, a layer having the same material as the cathode 16 is inevitably be formed on the partition structure 14. However, since the partition structure has the warpage structure, that is, the height of the gap between the lower surface of the end portion of the partition film layer and the substrate is greater than the thickness of the base film layer, the possibility that the cathode material is deposited on the partition structure is effectively reduced, and the thickness of the deposited cathode material decreases, while adjacent cathodes can be effectively partitioned, thereby preventing the adjacent cathodes from being coupled to cause short circuits.

Referring to FIG. 1, the above-mentioned partition structure 14 is a composited film layer structure, therefore, partition structure 14 can be a dual-layer film layer structure or a multi-layer film layer structure, which can be configured according to the actual needs. Taking the dual-layer structure as an example, the partition film layer 142 covers and protrudes beyond the base film layer 141. The end portion of the partition film layer 142 is the warpage structure 1421. The warpage structure 1421 can have a shape shown in FIG. 1, or can have any other warpage shape, as long as the partition structure 14 can partition the film layer located thereon and a film layer located at a side of the partition structure 14 which are formed in the same deposition process. For example, partition structure 14 is configured to divide the cathode layer located on the light-emitting layer into the cathodes isolated from one another. In other words, in a process of producing the cathodes, the above-mentioned partition structure separates the cathode layer into a plurality of regions isolated from one another, thereby effectively avoiding the short circuits caused by a continuous film layer formed between the cathodes, and improving the display performance and reliability of the display panel.

In an embodiment, as shown in FIGS. 1 and 2, in order to further improve the partition effect for the cathodes of the partition structure, warpage structures of different shapes, different sizes, and/or different angles can be formed at an end portion of each above-mentioned partition structure according to the requirements of an actual process.

In an embodiment, at least one end portion of the partition film layer of the partition structure is a warpage structure. Of course, two end portions of the partition film layer each can be a warpage structure. The warpage structure can be arranged according to the actual structural requirements, so as to guarantee the partition effect between the film layers.

In an embodiment, the distance between a peak of the lower surface of the partition film layer and the upper surface of the pixel defining layer is in a range from 300 nm to 450 nm. As shown in FIG. 1, the distance between the peak A of the lower surface of the partition film layer 142 and a plane where the upper surface 121 of the pixel defining layer 12 is located is in a range from 300 nm to 450 nm. The upper surface 121 of the pixel-defining layer 12 is a contact surface between the pixel-defining layer 12 and the cathode 16. In other embodiments, the distance between the peak A of the upper surface of the partition film layer 142 and the plane where the upper surface 121 of the pixel defining layer 12 is located can also be 350 nm, 400 nm, 450 nm, or the like. The distance between the peak of the lower surface of the partition film layer and the plane where the upper surface of the pixel defining layer is located can be configured according to a thickness of the film layer desired to be patterned or to be isolated in the semiconductor structure or in the display panel structure, thereby effectively isolating the film layer located on the partition structure.

Referring to FIG. 2, the partition structure 14 can include the base film layer 141 and the partition film layer 142, and the base film layer 141 and the partition film layer 142 are stacked in sequence in a direction away from an upper surface of the substrate. The base film layer 141 is an inorganic film layer.

In an embodiment, the inorganic film layer has a thickness in a range from 50 nm to 150 nm. The inventors have selected the inorganic film layer having a thickness of 70 nm, 90 nm, 100 nm, and 120 nm respectively as the base film layer to manufacture the partition structure. Through verifications in the actual processes, the inventors have found that the partition structure formed by the inorganic film layer having any one of the above-mentioned thicknesses can isolate the cathodes better, and guarantee the display reliability of the display panel. In order to realize the thinness of the display panel, the person skilled in the art, in the process of manufacturing the partition structure, an inorganic film layer having a smaller thickness can be selected as the base film layer to form the partition structure. The specific thickness can be selected and determined according to actual processes and application scenes.

In an embodiment, the material of the inorganic film layer can be a transparent inorganic material. The transparent inorganic material includes indium tin oxide, indium zinc oxide, indium tin oxide doped with silver, indium zinc oxide doped with silver, indium gallium zinc oxide, indium tin oxide, or zinc oxide doped with aluminum, and the like. A light transmittance of the transparent inorganic material can be greater than 70%, so as to guarantee the photosensitive effect of the photosensitive device, such as the camera, arranged under the transparent display panel, thereby achieving a better photographic effect. Of course, under the condition of guaranteeing the photosensitive effect of the photosensitive device, the light transmittance can also be another value, for example, 80% or 90%, so as to guarantee the light transmittance of the display panel and improve the photosensitive effect of the photosensitive device under the display, thereby achieving a full-screen display. Furthermore, other film layers in the display panel can also be made of transparent materials. In an embodiment, the transparent material used for manufacturing the first electrode and/or the second electrode includes at least one of indium tin oxide, indium zinc oxide, indium tin oxide doped with silver, and indium zinc oxide doped with silver. In an embodiment, the transparent material used for manufacturing the first electrode and/or the second electrode includes indium tin oxide doped with silver or indium zinc oxide doped with silver, so as to reduce a resistance of the first electrode and/or the second electrode under the condition of guaranteeing the high light transmittance of the display panel. Of course, the inorganic film layer can also be made of non-transparent materials, which can be configured according to the requirements of the actual process.

In an embodiment, the partition film layer is an organic film layer or an inorganic film layer. In a case that the partition film layer is an organic film layer, as shown in FIG. 2, the partition film layer 142 covers and protrudes beyond the upper surface of the base film layer 141. The warpage structure 1421 can be formed at the end portion of the partition film layer 142 by means of different patterning processes. The partition structure having the warpage structure can effectively isolate the film layer, such as the cathode formed on the partition structure, thereby avoiding short circuits between the adjacent cathodes.

In an embodiment, the organic film layer has a thickness in a range from 1 μm to 2 μm. Through verifications of experiments adopting the organic film layer having the thickness of 1.2 μm, 1.4 μm, 1.6 μm, or 1.8 μm, the inventors have found that in the actual processes, the partition structure formed by using the organic film layer having any one of the above-mentioned thicknesses as the partition film layer can isolate the cathode better, thereby guaranteeing the display effect of the display panel. Under the condition of partitioning the cathode and guaranteeing the display effect of the display panel, the person skilled in the art can select an organic film layer having a smaller thickness, so as to realize the thinness of the display panel.

In an embodiment, the material of the organic film layer is a transparent organic adhesive. Preferably, the transparent organic adhesive can be photosensitive polyimide or other transparent or non-transparent organic adhesive. The material can be selected according to the requirements of the specific process and application scenes, which will not be limited herein.

Figure 3:
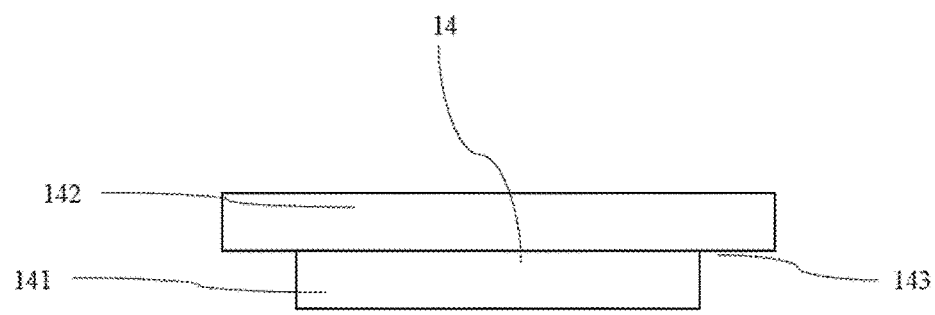
FIG. 3 is a schematic structural diagram illustrating the partition structure according to an embodiment.
Figure 4:
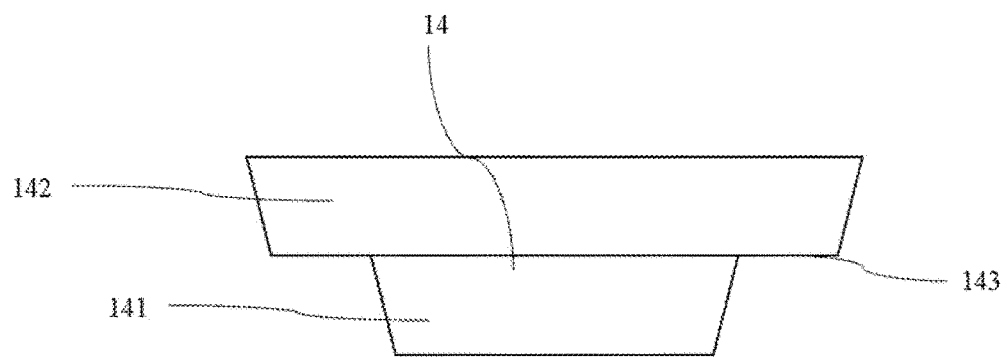
FIG. 4 is a schematic structural diagram illustrating an altered shape of the partition structure of the embodiment of FIG. 3.

As shown in FIGS. 3 and 4, the partition film layer 142 is an inorganic film layer, and the partition film layer 142 covers and protrudes beyond the upper surface of the base film layer 141. In this case, a height of a gap between the lower surface of the end portion of the partition film layer 142 and the lower surface of the base film layer 141 is equal to the thickness of the base film layer 141. The etch selectivity of the base film layer 141 and the partition film layer 142 is greater than 1, for example, the etch selectivity can be 3, 5, 10, or the like, so that the partition film layer 142 covers and protrudes beyond the base film layer 141 by means of the etching process (such as wet etching). When the partition film layer 142 is an inorganic film layer, the film material of the base film layer can be etched by dry etching or by wet etching. The thickness of the laminated layer of the partition structure can be configured to be in a range from 1.6 μm to 2.6 μm, thereby patterning or partitioning the film layer. Further, when the partition film layer is made of an inorganic material, it can also achieve the effect of a water vapor and oxygen barrier, thereby guaranteeing the display effect of the display panel.

In an embodiment, the material of the base film layer includes indium tin oxide, indium zinc oxide, indium tin oxide doped with silver, indium zinc oxide doped with silver, indium gallium zinc oxide, indium tin oxide, zinc oxide doped with aluminum, silicon nitride, silicon oxide, or the like. The materials of the base film layer 141 and the partition film layer 142 can be identical or different. When the materials of the base film layer 141 and the partition film layer 142 are identical, for example, the materials of the base film layer 141 and the partition film layer 142 are a negative photoresist, which can effectively reduce the difficulty and costs of the process.

Figure 5:
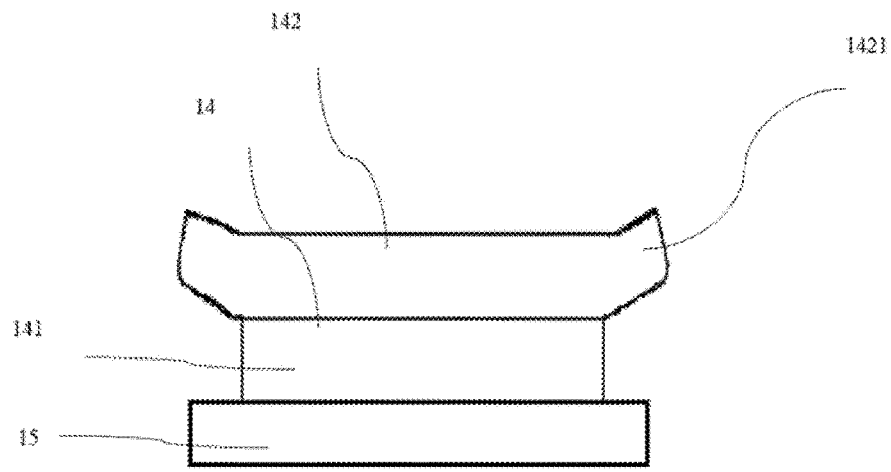
FIG. 5 is a schematic structural diagram illustrating another altered shape of the partition structure of the embodiment of FIG. 3.

In the embodiment shown in FIG. 5, the partition structure can also include a third film layer 15, the base film layer 141, and the partition film layer 142. That is, the third film layer 15, the base film layer 141, and the partition film layer 142 are stacked in sequence along a direction away from the upper surface of the substrate 10 to form the partition structure 14 shown in FIG. 5. In a process of etching the partition film layer 141, taking advantage of the difference between etching rates of the film layer materials, a recessed area is formed at a side of the base film layer 141, which corresponds to the sides of the third film layer 15 and the partition film layer 142. Alternatively, when the partition film layer is an organic film layer, the warpage structure 1421 is formed at the end portion of the partition film layer 142 by means of different patterning processes, so as to improve the partition effect of the partition structure for isolating the film layer located on the partition structure, such as the effect of isolating the cathode, thereby guaranteeing the display effect of the display panel. The specific patterning processes can be referred to the following specific embodiments.

In an embodiment, the partition structure can also be used to partition the wiring material layer, so as to form a plurality of wirings insulated from each other. Specifically, taking the AMOLED display panel as an example, a pixel circuit layer and wirings, such as scanning lines, data lines, and bezel wirings, which are connected to pixel circuits, are formed on the substrate. The wiring material layer is isolated by the partition structure, so as to form the plurality of wirings insulated from each other. The specific partition structure can be referred to the above-mentioned embodiments, which will not be repeatedly described herein. It should be noted that if the application scenes of the partition structure are different, the parameters, such as the thickness of the film layer structure of the partition structure, the distance between the peak of the lower surface of the partition film layer, and the plane where the lower surface of the base film layer is located, and the like, can vary according to the different application scenes, so as to isolate the film layer on the partition structure. In this embodiment, the pixel circuit can be a conventional pixel circuit in the AMOLED display panel, for example, a circuit including one thin film transistor (1T circuit), a circuit including two thin film transistors and one capacitor (2T-1C circuit), the circuit including three thin film transistors and one capacitor (3T-1C circuit), the circuit including three thin film transistors and two capacitors (3T-2C circuit), the circuit including seven thin film transistors and one capacitor (7T-1C circuit), or the circuit including seven thin-film transistors and two capacitors (7T-2C circuit). The pixel circuit will not be described herein in detail. The pixel circuits can also be only one thin film transistor in the AMOLED display panel.

Figure 6:
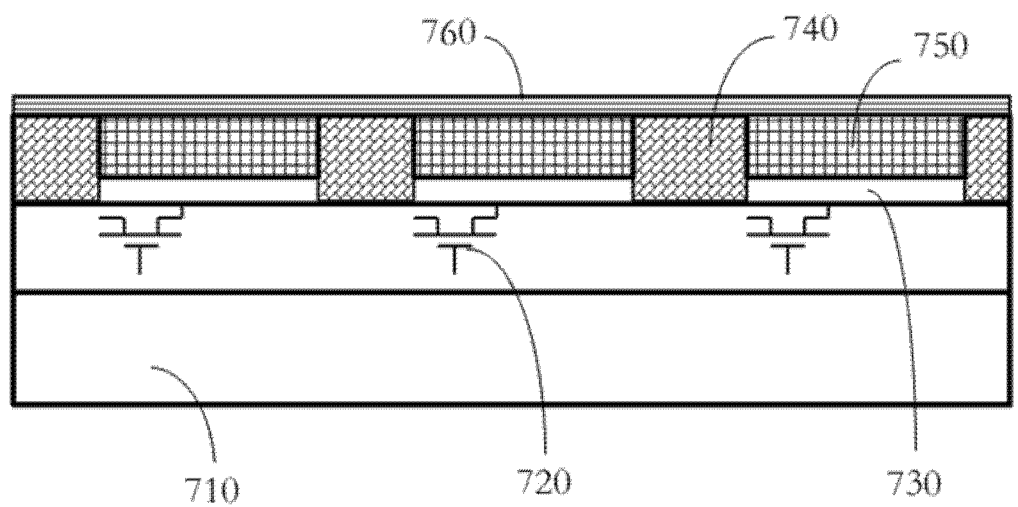
FIG. 6 is a cross-sectional view of an AMOLED display panel according to an embodiment.
Figure 7:
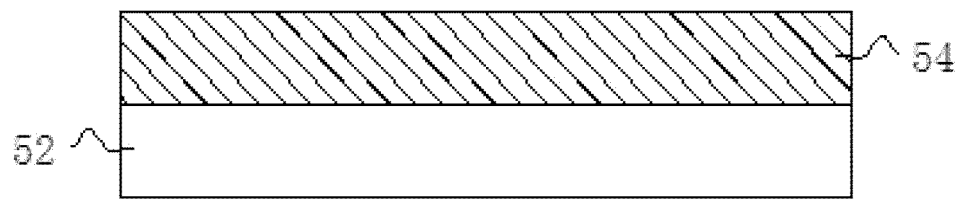
FIG. 7 is a schematic structural diagram illustrating a display terminal according to an embodiment.
Figure 8:
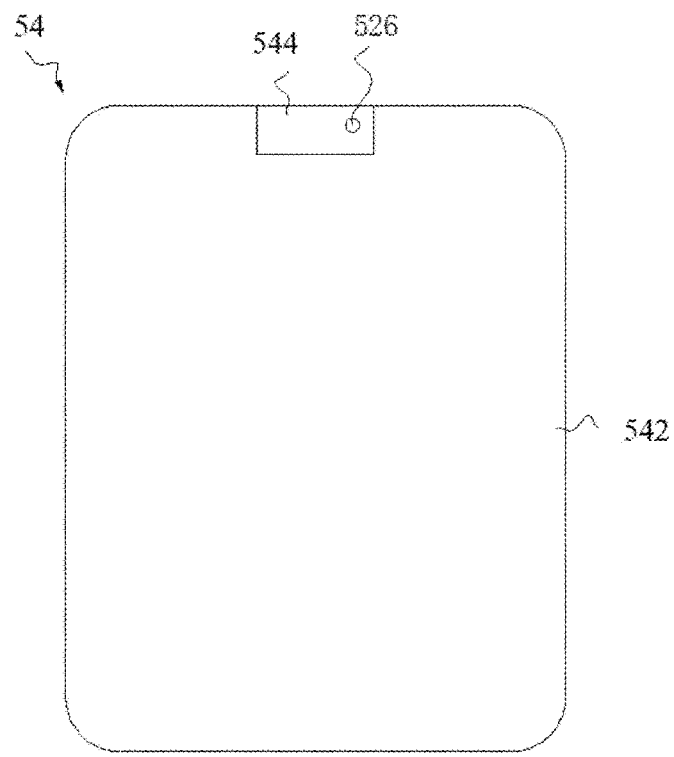
FIG. 8 is a schematic structural diagram illustrating a display panel shown in FIG. 7.
Figure 9:
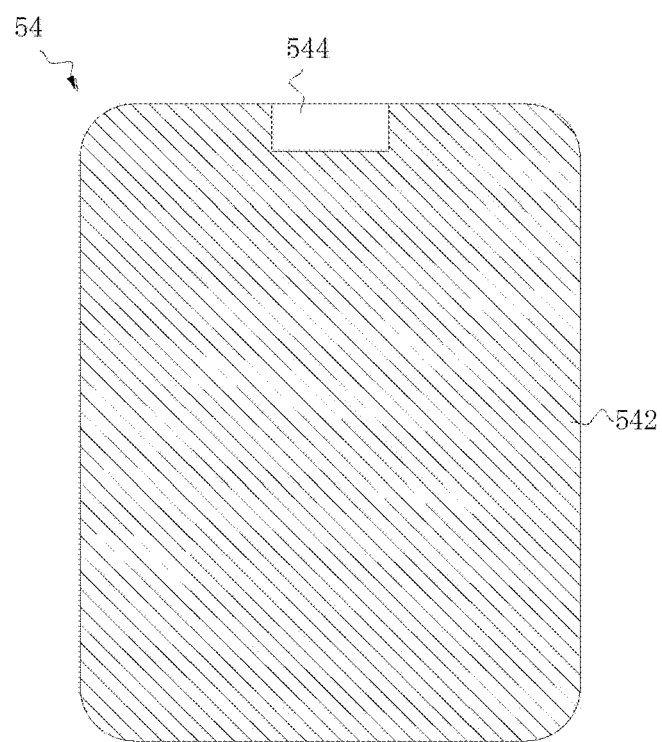
FIG. 9 is a schematic structural diagram illustrating a combined display panel shown in FIG. 8.

As shown in FIG. 6, the AMOLED display panel includes a substrate 710 and pixel circuits 720 (also referred to as a TFT array) disposed on the substrate 710. A first electrode layer is disposed on the pixel circuits 720. The first electrode layer includes a plurality of first electrodes 730. There is a one-to-one correspondence between the first electrodes 730 and the pixel circuits 720. In this embodiment, the first electrode 730 is an anode. The AMOLED display panel further includes a pixel-defining layer 740 disposed on the first electrodes 730. The pixel-defining layer 740 is provided with a plurality of openings. A light-emitting layer 750 is disposed in the openings to form a plurality of sub-pixels. There is a one-to-one correspondence between the sub-pixels and the first electrodes 730. A second electrode 760 is disposed on the light-emitting layer 750. The second electrode 760 is a cathode. The cathode is a surface electrode, that is, a whole surface electrode formed by a whole surface made of electrode materials. Scanning lines, data lines, and TFT switching components are disposed in the pixel circuits. The scan lines and the data lines are connected to the TFT switching components. The scanning lines control the TFT switching components to be turned on or to be off. When the pixel is ON, The data lines provide a driving current for the first electrode 730, so as to control the sub-pixel to emit light. In an embodiment of the present disclosure, a display terminal is further provided. As shown in FIGS. 7-9, the display terminal can include a device body 52 and a display 54. Display 54 covers the device body 52 and is interconnected with the device body 52. Moreover, display 54 can be provided with a region for a main display body 542 and a region for a secondary display body 544. The main display body 542 and the secondary display body 544 are configured to display a static image or a dynamic image. The secondary display body 544 is a transparent display, under which photosensitive devices such as a camera 526 and a light sensor can be provided.

Referring to FIG. 8, the above-mentioned display 54 includes the main display body 542 and the secondary display body 544, which are integrated. The main display body 542 can be an AMOLED display panel, and the secondary display body 544 can be a PMOLED display panel or the AMOLED display panel. The pixel circuits in the AMOLED display panel each include only one switching component (i.e. a driving TFT) but not any capacitor. When the secondary display body 544 is the PMOLED display panel, the secondary display 544 can be provided with the display panel of any one of the embodiments of the present disclosure. That is, it is possible to further improve the partition effect of the partition structure for isolating the cathode by means of the partition structure of any one of the embodiments corresponding to FIGS. 1 to 5, thereby avoiding the short circuits between adjacent cathodes, preventing the short circuits from affecting the display performance and display effect of the display terminal, and improving the display performance and effect of the combined display.

In an embodiment, the main display body 542 can be an AMOLED display panel, and the secondary display body 544 can be an AMOLED display panel. The wiring material layers in the main display body 542 and the secondary display body 544 can be provided with the partition structure of any one of the embodiments of the present disclosure, so as to further improve the effect of patterning or isolating the film layer (such as the wiring material layer) located on the partition structure.

In an embodiment, the above-mentioned display terminal can be any electronic device having a display, such as a mobile phone, a computer, a smartwatch, a smart wristband, and the like. Moreover, as shown in FIG. 9, in order to increase the amount of light received by the photosensitive device through the secondary display body 544, when the photosensitive device is operating, the secondary display body 544 is in a non-display state to improve the light transmittance of the secondary display body 544, thereby improving the performance of the photosensitive device receiving ambient light. When the photosensitive device is not operating, the secondary display body 544 is in a display state so as to increase the screen-body ratio, thereby realizing a true full-screen display.

Figure 10:
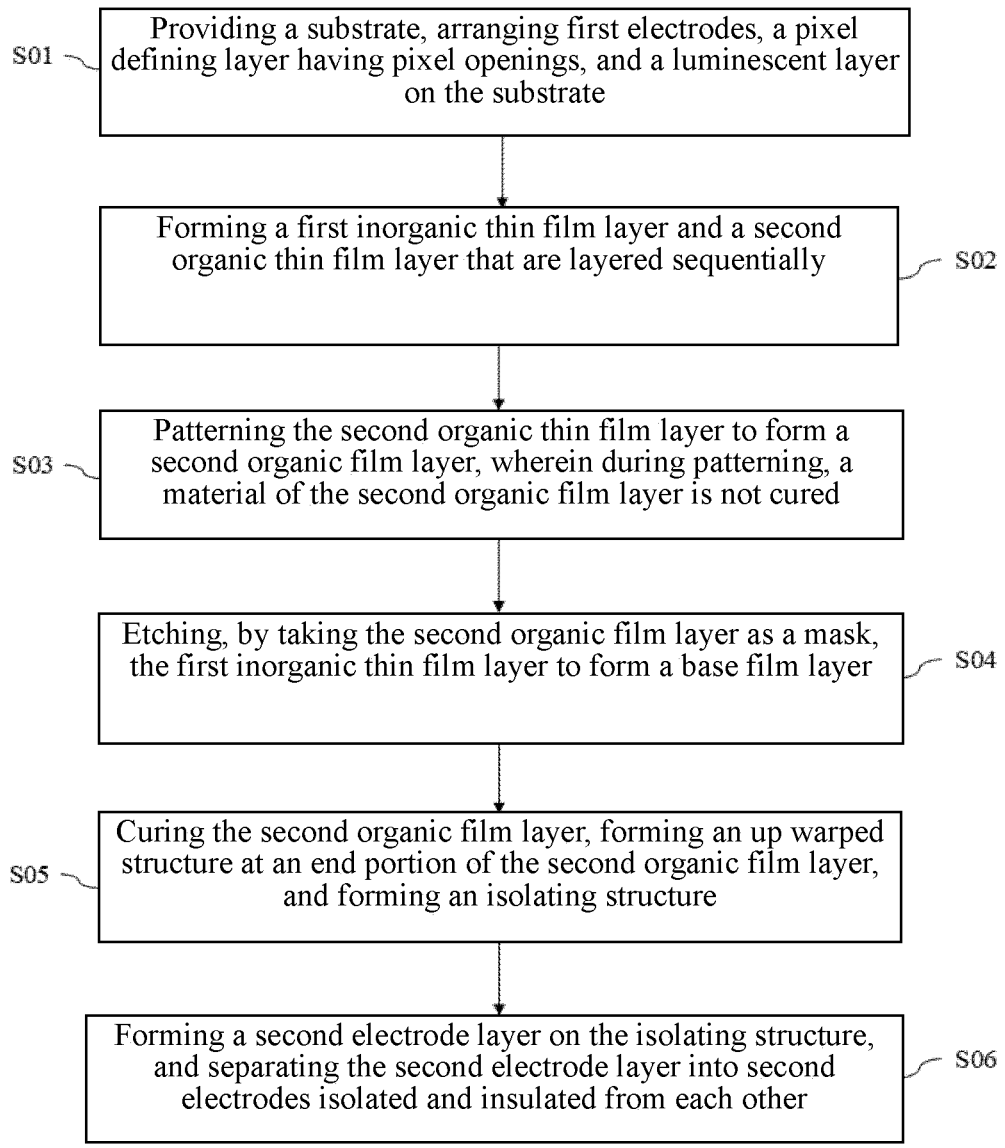
FIG. 10 is a flow chart of a manufacturing method for a display panel according to an embodiment.

In an embodiment, the present disclosure further provides a method for manufacturing a display panel, as shown in FIG. 10, and FIGS. 11A to 11E. FIG. 10 is a flow chart of a manufacturing method for a display panel according to an embodiment. FIGS. 11A to 11E are diagrams illustrating a process of manufacturing a partition structure having a warpage structure according to an embodiment. To address the present problem how to increase the screen-body ratio and realize a full-screen display, provided is a combined display formed by integrating an AMOLED display panel and a PMOLED display panel, where two display regions are configured to display a static image or a dynamic image. The PMOLED display panel is a transparent display panel. A photosensitive device, such as a camera or a light sensor, can be disposed under the transparent display panel. The transparent display panel is used to routinely display an image when the photosensitive device is not operating, but the transparent display panel is in a non-display state when the photosensitive device, such as the camera, is taking photographs, thereby guaranteeing the routine operation of the photosensitive device.

With respect to the patterning of the film layer in the display panel, such as the partition structure for the cathode in the PMOLED display panel, and the present partition structure for the cathode in the combined display formed by integrating the AMOLED display panel and the PMOLED display panel, the cathode material on the partition barrier is integrally connected to the cathode on the light-emitting layer in a process of forming the cathode by sputtering, thus resulting in short circuits between the cathodes of adjacent rows or adjacent columns. In a process of manufacturing a cathode of indium tin oxide (ITO) by means of PVD, since the cathode material of ITO has better step coverage on the partition column (such as the organic adhesive) for the cathode, and the AMOLED display panel in the combined display further limits the height (in general about 2.5 μm) of the partition column for the cathode, therefore, the partition effect of the partition column for isolating the cathode is not good. The present disclosure inventively provides a manufacturing method for a display panel, which can be performed to form the patterning or the partition structure for the film layer in the display panel, and which can manufacture the display panel of any one of the above-mentioned embodiments. The method can include following steps.

At step S01, a substrate is provided, and a first electrode, a pixel-defining layer having pixel openings, and a light-emitting layer are disposed on the substrate.

In this embodiment, the substrate can be a single-layer rigid substrate, such as a glass substrate, a quartz substrate, a plastic substrate, or the like. The substrate can also be a single-layer flexible substrate, such as a PI thin film or the like. Then, a corresponding functional layer, such as a buffer layer (BL) or the like, is manufactured on the substrate. Alternatively, in this embodiment, the substrate can be a multi-layer rigid substrate or a multi-layer flexible substrate. The multi-layer flexible substrate can include for example the glass substrate, a PI layer, the buffer layer (BL), and the like, which are stacked in sequence. Specifically, the substrate can be manufactured by means of processes, such as a double-layer PI process, a three-layer film process, and the like. These processes are common ones for manufacturing a display panel, and will not be repeatedly described herein. Of course, in this embodiment, the substrate can be the substrate of the PMOLED display panel or AMOLED display panel, or can be the substrate of the combined display formed by integrating the AMOLED display panel and the PMOLED display panel. The AMOLED display panel and the PMOLED display panel of the integrated display panel can share the same substrate. That is, the shared substrate is formed in one process, thereby simplifying the manufacturing processes of the combined display.

The structure of the combined display can be configured according to the application scenes thereof, and will not be described herein in detail.

Figure 11A:
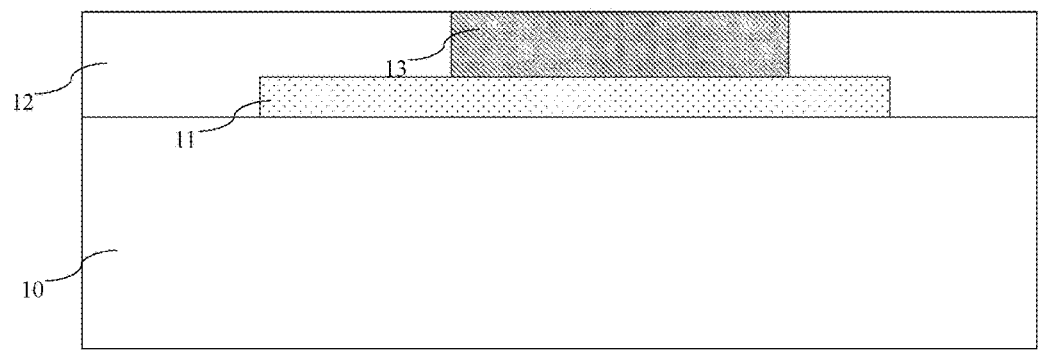
FIGS. 11A to 11E are diagrams illustrating a process of manufacturing a partition structure having a warpage structure according to an embodiment.

As shown in FIG. 11A, a first electrode-layer thin film is formed on the substrate 10. The first electrode is an anode. The first electrode thin film is etched and patterned to form a plurality of first electrodes 11. The pixel defining layer (PDL) 12 is formed on the first electrodes. The pixel-defining layer 12 is provided with pixel openings to expose the first electrodes 11. An organic light-emitting material is evaporated into the pixel openings to form a light-emitting layer 13. The light-emitting layer 13 is in contact with the first electrodes 11. As for the AMOLED display panel, pixel circuits are further arranged on the substrate 10. The pixel circuit can be a common pixel circuit, such as a 2T-1C circuit, a 3T-1C circuit, a 3T-2C circuit, a 7T-1C circuit, or a 7T-2C circuit, or can be a pixel circuit provided with only one transistor but not any capacitor.

At step S02, a first inorganic thin film layer and a second organic thin film layer are formed and arranged sequentially.

An indium tin oxide (ITO) thin film of 500 Å to 1500 Å is formed to be the first inorganic thin film layer. The first inorganic thin film layer can also be made of other inorganic materials, which will not be limited herein. The first inorganic thin film layer covers the pixel defining layer and the light-emitting layer. A second organic thin film layer is formed on the first inorganic thin film layer by means of coating.

Figure 11B:
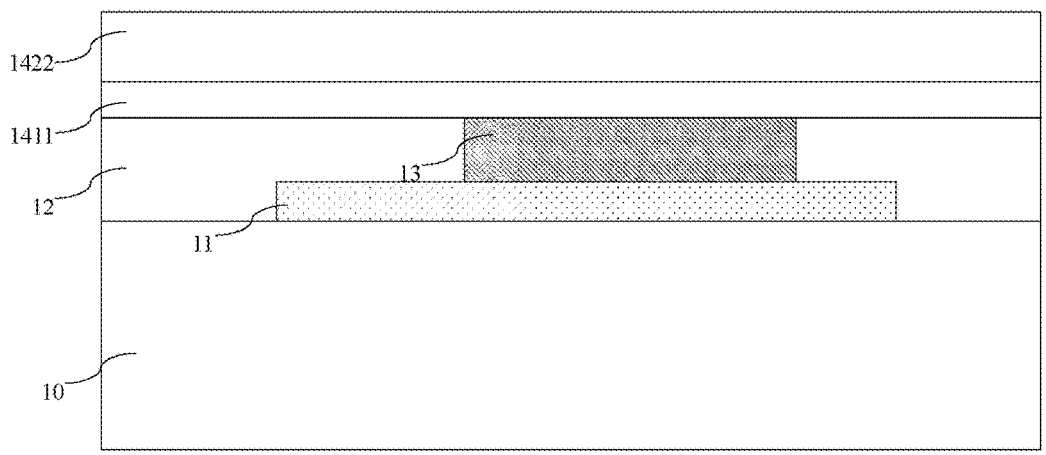

For example, as shown in FIG. 11B, an ITO thin film is manufactured and formed on the pixel defining layer 12 and the light-emitting layer 13 to function as the first inorganic-layer thin film 1411. The first inorganic thin film layer 1411 covers the upper surface of the pixel defining layer 12 and the upper surface of the light-emitting layer 13. The whole surface of the ITO thin film is coated with an organic adhesive to form the second organic thin film layer 1422. In this embodiment, the organic adhesive includes transparent or non-transparent organic adhesive, such as photosensitive polyimide.

At step S03, the second organic thin film layer is patterned to form a second organic film layer, and during the patterning, a material of the second organic film layer is not cured.

Figure 11C:
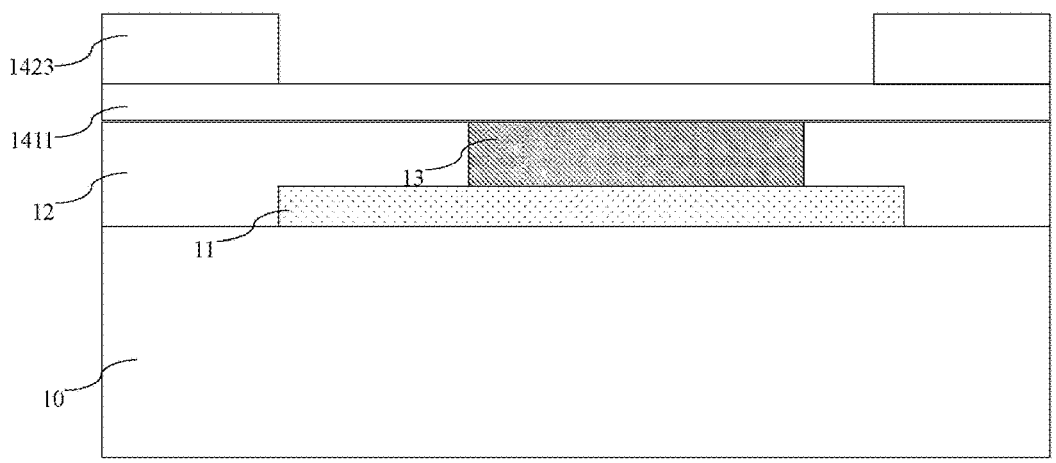

As shown in FIG. 11C, after exposing and developing processes, excessive organic adhesive is removed by means of an ashing process to form the second organic film layer 1423.

At step S04, by taking the second organic film layer 1423 as a mask, the first inorganic thin film layer is etched to form a base film layer 141.

Figure 11D:
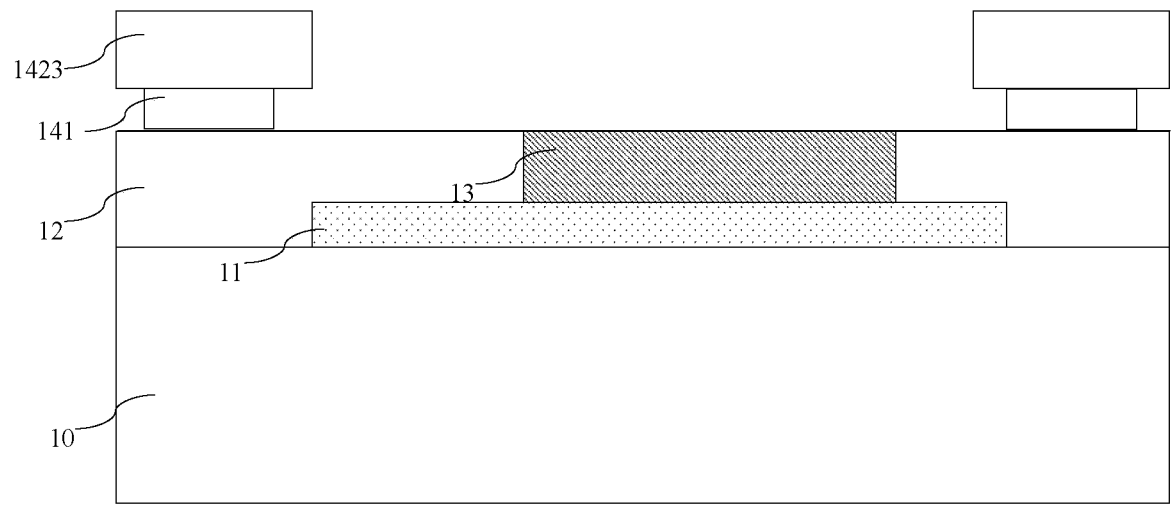

As shown in FIG. 11D, by taking the second organic film layer 1423 as the mask, a wet-etching is performed on the ITO thin film which functions as the first inorganic-layer thin film 1411. Since the second organic film layer 1423 is resistant to the above wet-etching solutions corrosion, a recess is then formed on the sidewall of the ITO thin film layer after a subsequent over-etching (i.e. a side etching). The recess can have a penetration depth in a range from 1 μm to 2.5 μm. In other optional embodiments, the penetration depth of the recess can be 1.5 μm, 2 μm, or the like. The penetration depth of the recess can be designed according to the process parameters of specific applications.

In an embodiment, an etching barrier thin film (not shown in the figures) is formed on a side of the first inorganic thin film layer 1411 proximate to the substrate. The etching barrier thin film covers the pixel defining layer 12 and the light-emitting layer 13. In a process of etching the first inorganic thin film layer by means of wet-etching, since the second organic thin film layer 1422 and the etching barrier thin film are resistant to the wet-etching solutions corrosion (the etch selectivity of the etching barrier thin film and the first inorganic thin film layer 1411 is less than 1), the film layers, such as the pixel definition layer 12 and the light-emitting layer 13, which are disposed under the etching barrier thin film, can be protected from the influences of the wet etching. The excessive etching barrier thin film is removed by means of etching. For example, the etching barrier thin film located on the light-emitting layer 13 and part of the etching barrier thin film located on the pixel defining layer 12 are removed by means of etching. That is, taking the base film layer 141 and the second organic film layer 1421 as a mask, the residue of the etching barrier thin film is removed, to form an etching barrier layer. The above-mentioned etching barrier layer, the ITO layer (the base film layer 141), and the organic adhesive layer (the second organic film layer 1423) are stacked in sequence.

At step S05, the second organic film layer is cured to form a warpage structure at an end portion of the second organic film layer, and the base film layer and a partition film layer provided with the warpage structure at the end portion are stacked in sequence to form a partition structure.

Figure 11E:
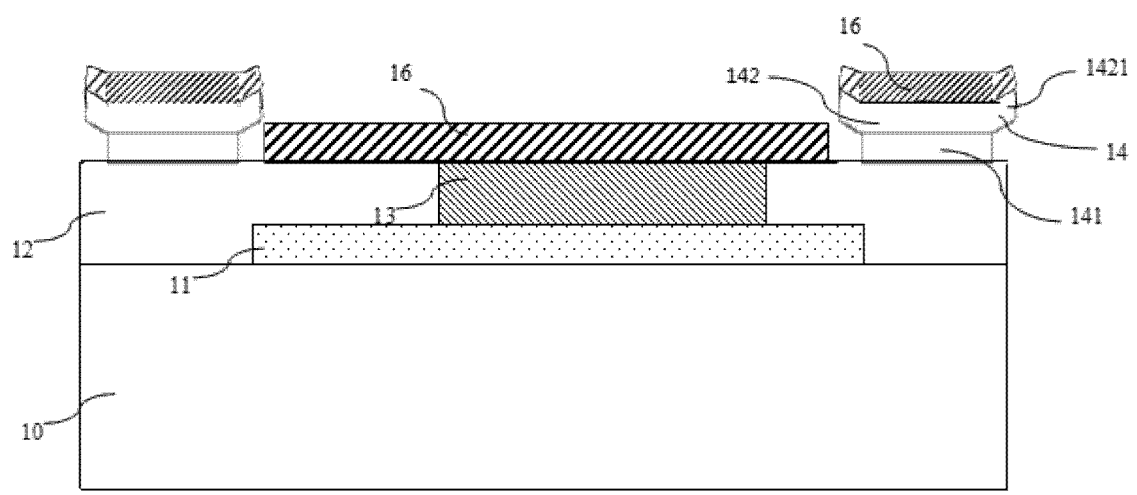

As shown in FIG. 11E, the second organic film layer 1423 is cured by means of baking. By controlling an annealing temperature, an annealing lasting time, a temperature rising rate and other process parameters of baking and curing, the warpage structure 1421 is formed at the end portion of the second organic film layer 1423, thereby forming the partition film layer 142, further forming the partition structure 14 including the base film layer 141 and the partition film layer 142 having the warpage structure at the end portion, which are stacked in sequence. A shape and a height of the warpage structure formed at the end portion of the partition film layer are affected by specific parameters of baking and curing. The corresponding parameters can be set according to the requirements of the actual application.

At step S06, a second electrode layer is formed on the partition structure, and the partition structure separates the second electrode layer into second electrodes isolated and insulated from each other.

Based on the formed partition structure 14 shown in FIG. 11E, a second electrode layer, i.e. a deposited cathode layer, is subsequently manufactured. Due to the configuration of the warpage structure 1421, the coverage property of the second electrode layer on the surface of the partition structure 14 can be further effectively reduced, that is, the partition structure having the warpage structure at the end portion can effectively separate the second electrode layer into the second electrode structures isolated and insulated from each other.

In the embodiments of the method for manufacturing the display panel, the probability of patterning or isolating of the subsequent film layer can be effectively improved by means of the partition structure formed by the composited film layer integrating the inorganic layer (i.e. ITO), the organic adhesive, and the like, and the warpage structure formed at the end portion of the organic adhesive.

All technical features in the embodiments can be executed in arbitrary combinations. For the purpose of simplifying the description, not all arbitrary combinations of the technical features in the embodiments above are described. However, as long as such combinations of the technical features are not contradictory, they should be considered as falling within the scope described in the specification.

The above embodiments merely illustrate several implementations of the disclosure. The description of the embodiments is relatively specific and detailed, but should not be understood to be limitations to the scope of the present disclosure. It should be noted that, for those skilled in the art, various deformations and improvements can be made without departing from the concept of the present application. These deformations and improvements are all within the protection scope of the present disclosure. Therefore, the protection scope of the present disclosure is defined by the appended claims.

What is claimed is:

1. A display panel, comprising a semiconductor structure, wherein the semiconductor structure comprises:
   a substrate; and
   a partition structure disposed on the substrate and arranged to partition a film layer disposed on the substrate;
   wherein the partition structure comprises at least a base film layer and a partition film layer which are stacked in sequence, the partition film layer covers an upper surface of the base film layer, and two end portions of the partition film layer each are configured to extend beyond the upper surface of the base film layer and bend upwards relative to the upper surface of the base film layer.

2. The display panel of claim 1, further comprising:
   a first electrode, disposed on the substrate; and
   a pixel-defining layer, disposed on the first electrode, wherein the pixel-defining layer is provided with a plurality of pixel openings, and a light-emitting layer is formed in the pixel openings to contact with the first electrodes.

3. The display panel of claim 2, wherein the partition structure is a first partition structure, the first partition structure is disposed on the pixel-defining layer to separate a second electrode layer into a plurality of second electrodes isolated and insulated from each other, and the second electrodes are located on the light-emitting layer.

4. The display panel of claim 1, further comprising a plurality of wires formed on the substrate, wherein the partition structure is a second partition structure disposed on the substrate, and a wiring material layer disposed on the substrate is separated by the second partition structure into the plurality of wirings isolated and insulated from each other.

5. The display panel of claim 2, wherein a distance between a peak of a lower surface of the partition film layer and an upper surface of the pixel-defining layer is in a range from 300 nm to 450 nm.

6. The display panel of claim 1, wherein the base film layer is an inorganic film layer, and the partition film layer is an organic film layer.

7. The display panel of claim 6, wherein an etch selectivity of the base film layer and the partition film layer is greater than 1.

8. The display panel of claim 6, wherein the inorganic film layer has a thickness in a range from 50 nm to 150 nm, and the organic film layer has a thickness in a range from 1 μm to 2 μm.

9. The display panel of claim 6, wherein a material of the inorganic film layer is a transparent inorganic material, and a material of the organic film layer is a transparent organic adhesive.

10. The display panel of claim 9, wherein a light transmittance of the material of the inorganic film layer is greater than 70%.

11. The display panel of claim 9, wherein a light transmittance of the material of the organic film layer is greater than 70%.

12. The display panel of claim 6, wherein a material of the inorganic film layer is indium tin oxide, indium zinc oxide, indium tin oxide doped with silver, indium zinc oxide doped with silver, indium gallium zinc oxide, indium tin oxide, or zinc oxide doped with aluminum.

13. The display panel of claim 6, wherein a material of the organic film layer is photosensitive polyimide.

14. The display panel of claim 1, wherein the display panel is a AMOLED display panel, a pixel circuit of the AMOLED display panel is a circuit comprising one thin film transistor, a circuit comprising two thin film transistors and one capacitor, a circuit comprising three thin film transistors and one capacitor, a circuit comprising three thin film transistors and two capacitors, a circuit comprising seven thin film transistors and one capacitor, or a circuit comprising seven thin film transistors and two capacitors.

* * * * *